United States Patent
Antonyan

(10) Patent No.: US 9,349,428 B2
(45) Date of Patent: May 24, 2016

(54) SENSE AMPLIFIER, NONVOLATILE MEMORY DEVICE INCLUDING THE SENSE AMPLIFIER AND SENSING METHOD OF THE SENSE AMPLIFIER

(71) Applicant: Artur Antonyan, Suwon-si (KR)

(72) Inventor: Artur Antonyan, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/515,158

(22) Filed: Oct. 15, 2014

(65) Prior Publication Data

US 2015/0170726 A1 Jun. 18, 2015

(30) Foreign Application Priority Data

Dec. 16, 2013 (KR) .................. 10-2013-0156517

(51) Int. Cl.
*G11C 11/16* (2006.01)
*G11C 13/00* (2006.01)
*G11C 7/06* (2006.01)

(52) U.S. Cl.
CPC .......... *G11C 11/1673* (2013.01); *G11C 13/004* (2013.01); *G11C 7/062* (2013.01); *G11C 2013/0054* (2013.01); *G11C 2013/0057* (2013.01)

(58) Field of Classification Search
CPC ................................................. G11C 11/1673
USPC ............................................ 365/189.07, 207
See application file for complete search history.

(56) References Cited

U.S. PATENT DOCUMENTS

| | | | |
|---|---|---|---|
| 6,169,689 B1 | 1/2001 | Naji | |
| 6,388,917 B2 | 5/2002 | Hoffmann et al. | |
| 6,747,891 B2 | 6/2004 | Hoffmann et al. | |
| 6,781,873 B2 | 8/2004 | Ishikawa et al. | |
| 6,788,571 B2 | 9/2004 | Ooishi et al. | |
| 6,791,890 B2 | 9/2004 | Ooishi | |
| 7,016,220 B2 | 3/2006 | Lee et al. | |
| 7,283,407 B2 | 10/2007 | Inoue et al. | |
| 7,561,461 B2 | 7/2009 | Nagai et al. | |
| 8,320,166 B2 | 11/2012 | Park et al. | |
| 8,416,614 B2 | 4/2013 | Chen et al. | |
| 2002/0018361 A1 | 2/2002 | Hoffmann et al. | |
| 2003/0103395 A1 | 6/2003 | Ooishi | |
| 2003/0179602 A1 | 9/2003 | Lee et al. | |
| 2003/0218901 A1 | 11/2003 | Ooishi et al. | |

(Continued)

FOREIGN PATENT DOCUMENTS

| | | |
|---|---|---|
| JP | 4775926 B2 | 9/2011 |
| JP | 5288103 B2 | 9/2013 |

(Continued)

*Primary Examiner* — Hoai V Ho
*Assistant Examiner* — Tri Hoang
(74) *Attorney, Agent, or Firm* — Sughrue Mion, PLLC

(57) ABSTRACT

A sense amplifier, a nonvolatile memory device including the sense amplifier and a sensing method of the sense amplifier are provided. The sense amplifier includes a first comparator that generates a first comparison signal by comparing a first reference signal received from a first reference cell with a sensing target signal received from the selected memory cell, and generates a second comparison signal by comparing the sensing target signal with a second reference signal received from a second reference cell written in different state from the first reference cell, and a second comparator that senses data stored in the selected memory cell by comparing the first comparison signal and the second comparison signal.

17 Claims, 13 Drawing Sheets

(56) References Cited

U.S. PATENT DOCUMENTS

| | | | |
|---|---|---|---|
| 2004/0017712 A1 | 1/2004 | Hoffmann et al. | |
| 2004/0047216 A1 | 3/2004 | Ishikawa et al. | |
| 2005/0169038 A1 | 8/2005 | Inoue et al. | |
| 2006/0023518 A1* | 2/2006 | Iwata | G11C 7/062 365/189.07 |
| 2007/0115031 A1* | 5/2007 | Hsu | G11C 7/02 327/52 |
| 2008/0205119 A1 | 8/2008 | Nagai et al. | |
| 2009/0067233 A1 | 3/2009 | Park et al. | |
| 2012/0127787 A1 | 5/2012 | Chen et al. | |

FOREIGN PATENT DOCUMENTS

| | | |
|---|---|---|
| KR | 10-2012-0091583 A | 8/2012 |
| KR | 10-2014-0128492 A | 11/2014 |

* cited by examiner

SENSE AMPLIFIER, NONVOLATILE MEMORY DEVICE INCLUDING THE SENSE AMPLIFIER AND SENSING METHOD OF THE SENSE AMPLIFIER

CROSS-REFERENCE TO RELATED APPLICATIONS

This U.S. non-provisional patent application claims priority under 35 U.S.C. §119 of Korean Patent Application No. 10-2013-0156517, filed on Dec. 16, 2013, the entire contents of which are hereby incorporated by reference.

BACKGROUND

Methods, devices, and articles of manufacture consistent with the present disclosure relate to a sense amplifier, a nonvolatile memory device including the sense amplifier and a sensing method of the sense amplifier.

A magnetic random access memory (MRAM) stores data using a resistance change of a magnetic tunneling junction (MTJ) element of a memory cell. A resistance of the MTJ element is changed depending on a magnetization direction of a free layer. When a magnetization direction of a free layer is identical to a magnetization direction of a pinned layer, the MTJ element has a low resistance value. When a magnetization direction of a free layer is opposite to a magnetization direction of a pinned layer, the MTJ element has a high resistance value. The low resistance value of the MTJ element corresponds to data '0' and the high resistance value of the MTJ element corresponds to data '1'.

Among data recoding methods of MRAM, there is a method of recording data in a MTJ element using a digit line. In a MRAM adopting the recording method described above, a write current is applied to a digit line installed to be spaced apart from the MTJ element and a magnetization direction of a free layer is changed using a magnetic field generated from the write current. A read current is applied between both ends of the MTJ element. In the MRAM, a path of a read current is different from a path of a write current. However, in case of a spin transfer torque magnetic random access memory (STT-MRAM) which does not use a digit line, a path of a read current is identical to a path of a write current.

SUMMARY

According to an aspect of one or more exemplary embodiments, there is provided a sense amplifier that senses data stored in a selected memory cell, the sense amplifier comprising a first comparator that generates a first comparison signal by comparing a first reference signal received from a first reference cell with a sensing target signal received from the selected memory cell, and generates a second comparison signal by comparing the sensing target signal with a second reference signal received from a second reference cell written in different state from the first reference cell; and a second comparator that senses data stored in the selected memory cell by comparing the first comparison signal and the second comparison signal.

According to another aspect of one or more exemplary embodiments, there is provided a nonvolatile memory device comprising a memory cell array comprising a memory cell that stores data, a first reference cell that is written in a first state and a second reference cell that is written in a second state different from the first state; and a sense amplifier that senses data stored in the memory cell using the first and second reference cells, wherein the sense amplifier comprises a first comparator that compares a first reference signal and a second reference signal received from the first reference cell and the second reference cell with a sensing target signal received from the memory cell respectively to generate a first comparison signal and a second comparison signal; and a second comparator that compares the first comparison signal with the second comparison signal to sense data stored in the memory cell on the basis of a comparison result.

According to yet another aspect of one or more exemplary embodiments, there is provided a sensing method of a nonvolatile memory device, the sensing method comprising storing a first state and a second state using cells which are the same as a memory cell that stores data; and sensing data stored in a selected memory cell using a plurality of comparison operations using first and second reference signals being provided from the cells in which the first state and the second state are stored when a read operation is performed.

BRIEF DESCRIPTION OF THE FIGURES

Exemplary embodiments will be described below in more detail with reference to the accompanying drawings. The exemplary embodiments may, however, be embodied in different forms and should not be constructed as limited to the exemplary embodiments set forth herein. Rather, these exemplary embodiments are provided so that this disclosure will be thorough and complete, and will fully convey the scope of the inventive concept to those skilled in the art. Like numbers refer to like elements throughout.

DETAILED DESCRIPTION

Figure 1:
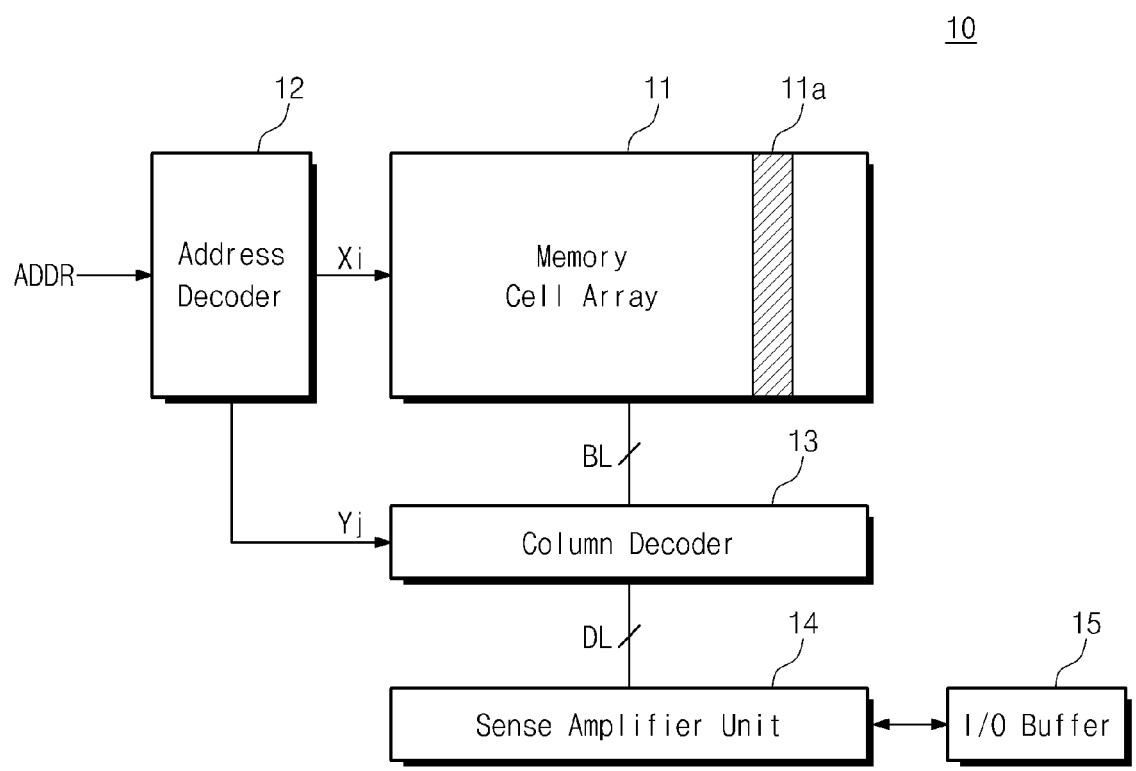
FIG. 1 is a block diagram illustrating a nonvolatile memory device in accordance with some exemplary embodiments.

Exemplary embodiments will be described more fully hereinafter with reference to the accompanying drawings, in which exemplary embodiments are shown. This inventive concept may, however, be embodied in many different forms and should not be construed as limited to the exemplary embodiments set forth herein. Rather, these exemplary embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

FIG. 1 is a block diagram illustrating a nonvolatile memory device in accordance with some exemplary embodiments. Referring to FIG. 1, a nonvolatile memory device 10 includes a memory cell array 11, an address decoder 12, a column decoder 13, a sense amplifier unit 14 and an input/output (I/O) buffer 15.

The nonvolatile memory device 10 generates a plurality of reference signals using a plurality of reference cells written in a different state. The nonvolatile memory device 10 can perform a first comparison operation comparing the reference signals with a sensing target signal provided from selected memory cells respectively. The nonvolatile memory device 10 can perform a second comparison operation on the basis of a result of the first comparison operation to sense data stored in a selected memory cell. The nonvolatile memory device 10 can precisely sense data using reference signals being provided from the reference cells through the two comparison operations.

The memory cell array 11 includes a plurality of nonvolatile memory cells to store data. The memory cell array 11 may include memory cells constituted by a phase change random access memory (PRAM), a nano floating gate memory (NFGM), a polymer random access memory (PoRAM), a magnetic random access memory (MRAM), a ferroelectric random access memory (FRAM), a resistive memory such as a resistance random access memory (RRAM), etc.

The memory cell array 11 may include spin transfer torque magneto resistive random access memory (STT-MRAM) cells.

The memory cell array 11 includes a reference cell area 11a. The reference cell area 11a includes a plurality of reference cells. The reference cells are used to generate a reference signal, for example, a reference voltage or a reference current, for reading data stored in the memory cell array 11. The reference cells may be constituted to be the same with memory cells of the memory cell array 11. Alternatively, the reference cells may be constituted to be a portion of the memory cells of the memory cell array 11. The reference cell may be a STT-MRAM.

A location of the reference cell area 11a in the memory cell array 11 may be fixed. Alternatively, a location of the reference cell area 11a may be fluidly set by an external control or an internal control of the nonvolatile memory device 10.

The reference cell area 11a includes at least two reference cells being programmed in different program states. The two reference cells programmed in different program states can make a pair with each other (i.e., a pair of two reference cells) to read data stored in a selected memory cell.

Memory cells included in the memory cell array 11 may be selected by a row address Xi and a column address Yj. At least one word line is selected by a row address Xi and at least one bit line BL is selected by a column address Yj.

The address decoder 12 receives an address (ADDR) to decode the received address to a row address Xi and a column address Yj. The address decoder 12 selects one word line among a plurality of word lines according to the row address Xi. The address decoder 12 transmits the column address Yj to the column decoder 13. The column decoder 13 connects a data line DL to a selected bit line BL according to the column address Yj.

The sense amplifier unit 14 includes a plurality of sense amplifiers. Each sense amplifier senses data recorded in a selected memory cell of the memory cell array 11. The sense amplifier unit 14 amplifies sensed data to convert the amplified data into a binary logical value. The sense amplifier unit 14 transmits the converted data to the input/output buffer 15.

The sense amplifier unit 14 compares a sensing target signal being provided from a selected memory cell with a reference signal. The sense amplifier unit 14 determines whether data written in a memory cell is logical "0" or logical "1" according to a comparison result.

The sense amplifier unit 14 may compare a plurality of reference signals being provided from a plurality of reference cells with a sensing target signal. The sense amplifier unit 14 may perform a first comparison operation comparing the reference signals with the sensing target signal respectively. The sense amplifier unit 14 can perform a second comparison operation on the basis of a result of the first comparison operation to sense data stored in the selected memory cell.

The input/output buffer 15 temporarily stores data provided from an external device to transmit the stored data to the sense amplifier unit 14. The input/output buffer 15 temporarily stores output data being provided from the sense amplifier unit 14 to transmit the stored output data to an external device.

The nonvolatile memory device 10 may precisely sense data using reference signals being provided from the reference cells through the two comparison operations.

Figure 2:
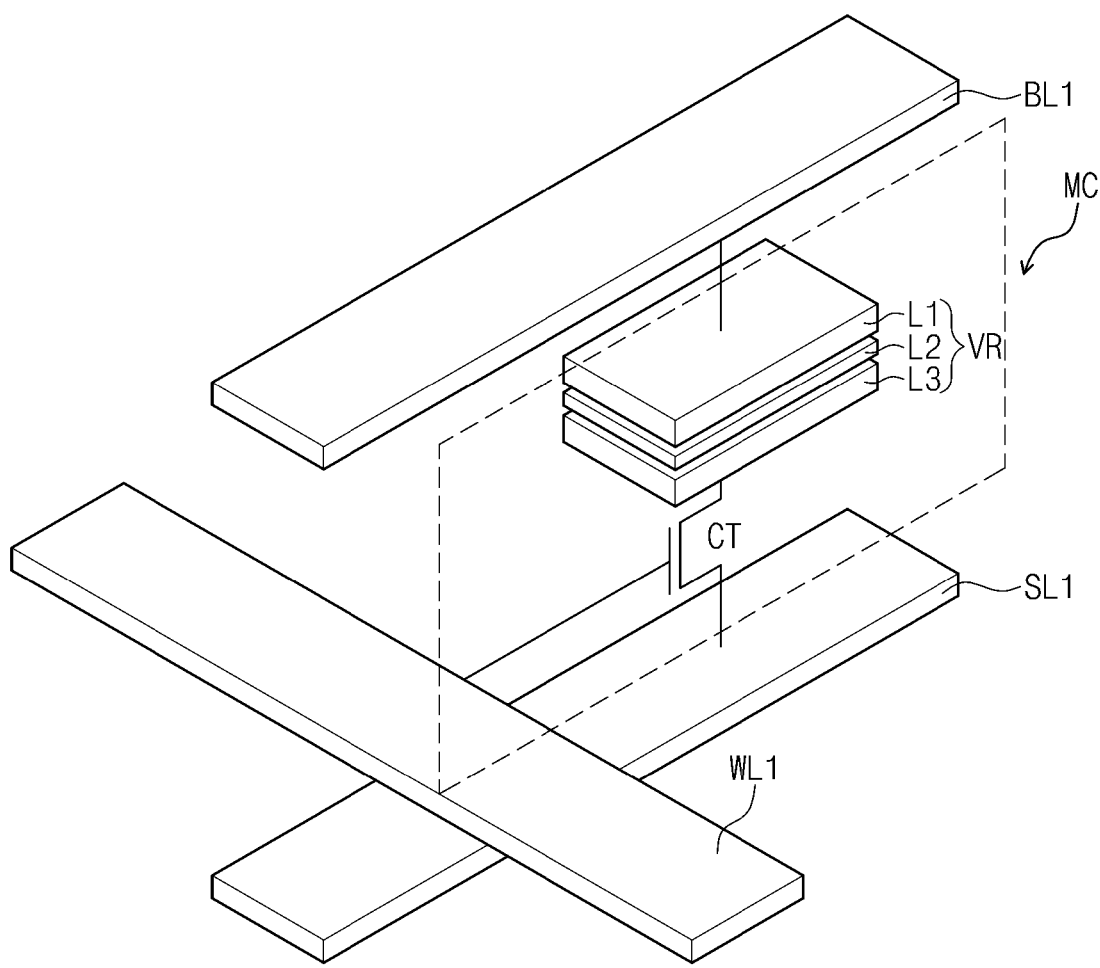
FIG. 2 is a drawing illustrating a memory cell included in a memory cell array of the nonvolatile memory device of FIG. 1, according to an exemplary embodiment.

FIG. 2 is a drawing illustrating a memory cell included in a memory cell array of the nonvolatile memory device of FIG. 1, according to an exemplary embodiment. In FIG. 2, a memory cell MC is constituted by a STT-MRAM.

The memory cell MC may include a variable resistance device VR and a cell transistor CT. A gate of the cell transistor CT is connected to a word line (for example, a first word line WL1). One electrode of the cell transistor CT is connected to a bit line (for example, a first bit line BL1) through the variable resistance device VR. The other electrode of the cell transistor CT is connected to a source line (for example, a first source line SL1).

The variable resistance device VR include a free layer L1, a pinned layer L3 and a tunnel layer L2 disposed between the free layer L1 and the pinned layer L3. A magnetization direction of the pinned layer L3 is pinned. A magnetization direction of the free layer L1 is identical or opposite to a magnetization direction of the pinned layer L3 depending on a given condition. The variable resistance device VR may further include an anti-ferromagnetic layer (not illustrated) to pin a magnetization direction of the pinned layer L3.

When a read operation is performed on the memory cell MC, a voltage of logic high is applied to the word line WL1. The cell transistor MC is turned on or off according to a voltage of the word line WL1. For example, when the logic high is applied to the word line WL1, the cell transistor MC is turned on, and a read current is provided from the bit line BL1 toward the source line SL to measure a resistance value of the variable resistance device VR. Data stored in the variable resistance device VR may be distinguished according to a resistance value being measured.

Figure 3:
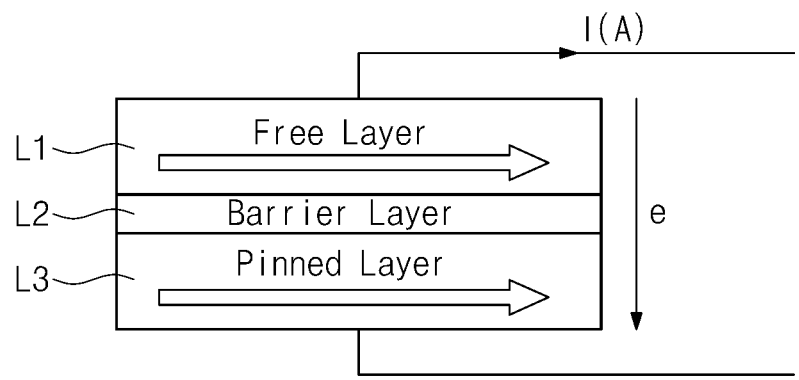
FIGS. 3 and 4 are drawings indicating a magnetization direction of a variable resistance element in accordance with data stored in the memory cell of FIG. 2.
Figure 4:
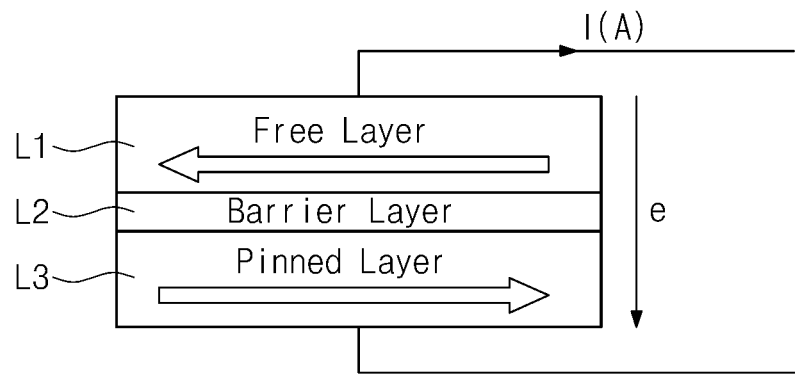

FIGS. 3 and 4 are drawings indicating a magnetization direction of a variable resistance element in accordance with data stored in the memory cell of FIG. 2.

A resistance value of the variable resistance device VR changes depending on a magnetization direction of the free layer L1. If a read current I is provided to the variable resistance device VR, a data voltage according to a resistance value of the variable resistance device VR is output. Since the intensity of the read current I is smaller than the intensity of a write current, a magnetization direction of the free layer L1 is not changed by the read current I. For example, the intensity of the read current I may be an order of magnitude smaller than the intensity of the write current.

Referring to FIG. 3, in the variable resistance device VR, a magnetization direction of the free layer L1 is disposed to be parallel to a magnetization direction of the pinned layer L3. That is, the charges of the free layer L1 move parallel to the movement of charges of the pinned layer L3, such that the magnetization direction of the free layer L1 is the same as the magnetization direction L3 of the pinned layer L3. Thus, the variable resistance device VR has a low resistance value. In this case, data can read out "0".

Referring to FIG. 4, in the variable resistance device VR, a magnetization direction of the free layer L1 is disposed to be opposite to a magnetization direction of the pinned layer L3. Thus, the variable resistance device VR has a high resistance value. In this case, data can read out "1".

In FIGS. 3 and 4, the free layer L1 and the pinned layer L3 are illustrated as a horizontal magnetic device. However, the inventive concept is not limited to the horizontal magnetic device. The free layer L1 and the pinned layer L3 may be provided using a vertical magnetic device.

Figure 5:
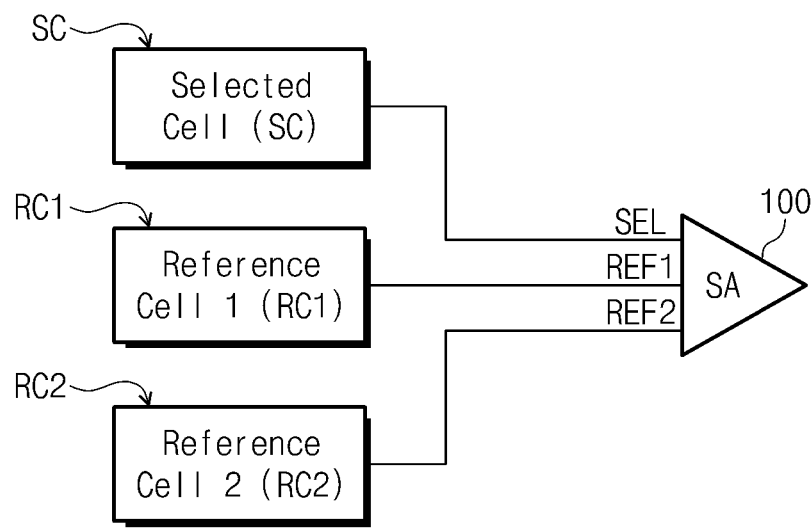
FIG. 5 is a block diagram illustrating a sense amplifier included in a sense amplifier unit of FIG. 1, according to an exemplary embodiment.

FIG. 5 is a block diagram illustrating a sense amplifier included in a sense amplifier unit of the nonvolatile memory device of FIG. 1, according to an exemplary embodiment. Referring to FIG. 5, a sense amplifier 100 is connected to a selected memory cell SC and a plurality of reference cells. The plurality of reference cells may include a first reference cell RC1 written in a 1 state and a second reference cell RC2 written in a 2 state. The first reference cell RC1 stores a 1-bit value. In this exemplary embodiment, the 1-bit value may be data "0". The second reference cell RC2 stores a 2-bit value. In this exemplary embodiment, the 2-bit value may be data "1".

In this embodiment, the 1 state may be a high resistance state, and the 2 state may be a low resistance state. However, the number of reference cells connected to the sense amplifier 100 and their states are not limited to the exemplary embodiment described above.

The sense amplifier 100 receives a sensing target signal SEL from a selected memory cell SC. The sense amplifier 100 receives a first reference signal REF1 and a second reference signal REF2 from the first reference cell RC1 and the second reference cell RC2, respectively. The first reference signal REF1 and the second reference signal REF2 can be provided in the form of a reference current. Alternatively, the first reference signal REF1 and the second reference signal REF2 can be provided in the form of a reference voltage.

The sense amplifier 100 compares the first reference signal REF1 with the sensing target signal SEL to generate a first comparison signal during a first comparison operation. The sense amplifier 100 compares the second reference signal REF2 with the sensing target signal SEL to generate a second comparison signal during the first comparison operation. The sense amplifier 100 performs a second comparison operation on the basis of a result of the first comparison operation. The sense amplifier 100 may compare the first comparison signal and the second comparison signal to sense data stored in a selected memory cell SC during the second comparison operation.

Figure 6:
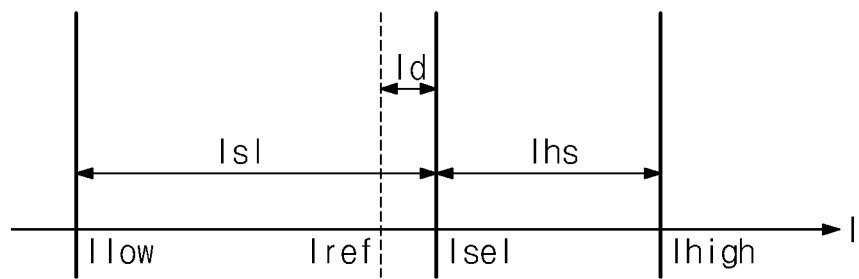
FIG. 6 is a drawing for explaining a two-stage comparison operation of the sense amplifier of FIG. 5 according to an exemplary embodiment.

FIG. 6 is a drawing for explaining a two-stage comparison operation of the sense amplifier of FIG. 5, according to an exemplary embodiment. A horizontal axis in FIG. 6 represents a level of a current.

The first reference cell RC1 written in a 1 state provides a low reference current Ilow to the sense amplifier 100 as the first reference signal REF1. The second reference cell RC2 written in a 2 state provides a high reference current Thigh to the sense amplifier 100 as the second reference signal REF2. The selected cell SC provides a sensing target current Isel to the sense amplifier 100 as a sensing target signal.

An intermediate reference current Tref is a median value between the low reference current Ilow and the high reference current Thigh. The sense amplifier 100 can sense a current margin (Id) which is a level difference between the intermediate reference current Tref and the sensing target current Isel to distinguish data stored in the selected memory cell SC.

The sense amplifier 100 performs at least two comparison operations to more precisely sense the current margin Id. The sense amplifier 100 compares a plurality of reference currents (Thigh, Ilow) with the sensing target current Isel respectively to generate a plurality of comparison signals during the first comparison operation. The sense amplifier 100 then compares the plurality of comparison signals to sense the current margin (Id) during the second comparison operation.

For example, in a first comparison operation, the sense amplifier 100 subtracts the low reference current Ilow and the sensing target current Isel from each other to generate a first comparison signal Isl, and the sense amplifier 100 subtracts the sensing target current Isel and the high reference current Thigh from each other to generate a second comparison signal Ihs. Then, in a second comparison operation, the sense amplifier 100 subtracts the first comparison signal Isl and the second comparison signal Ihs from each other to output a subtracted result as an output signal. The first comparison signal Isl, the second comparison signal Ihs and the output signal OUT are represented by mathematical formulas 1 through 3.

$$Isl = Isel - Ilow \qquad \text{[mathematical formula 1]}$$

$$Ihs = Ihigh - Isel \qquad \text{[mathematical formula 2]}$$

$$OUT = Ihs - Isl = Ihigh + Ilow - 2Isel = 2(Iref - Isel) = 2Id \qquad \text{[mathematical formula 3]}$$

Referring to FIGS. 1 through 3, the sense amplifier 100 can provide two times current margin (Id) as an output signal through a two-stage comparison operation.

Figure 7:
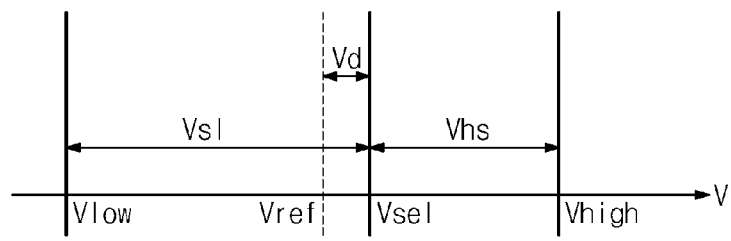
FIG. 7 is a drawing for explaining a two-stage comparison operation of the sense amplifier of FIG. 5, according to another exemplary embodiment.

FIG. 7 is a drawing for explaining a two-stage comparison operation of the sense amplifier of FIG. 5, according to another exemplary embodiment. A horizontal axis in FIG. 7 represents voltage amplitude.

The first reference cell RC1 written in a 1 state provides a low reference voltage Vlow to the sense amplifier 100 as a first reference signal REF1. The second reference cell RC2 written in a 2 state provides a high reference voltage Vhigh to the sense amplifier 100 as the second reference signal REF2.

The selected cell SC provides a sensing target voltage Vsel to the sense amplifier 100 as a sensing target signal.

An intermediate reference voltage Vref is a median value between the low reference voltage Vlow and the high reference voltage Vhigh. The sense amplifier 100 can sense a voltage margin (Vd) which is a level difference between the intermediate reference voltage Vref and the sensing target voltage Vsel to distinguish data stored in the selected memory cell SC.

The sense amplifier 100 performs at least two comparison operations to more precisely sense the voltage margin Vd. For example, in a first comparison operation, the sense amplifier 100 subtracts the low reference voltage Vlow and the sensing target voltage Vsel from each other to generate a first comparison signal Vsl, and the sense amplifier 100 subtracts the sensing target voltage Vsel and the high reference voltage Vhigh from each other to generate a second comparison signal Vhs. Then, in a second comparison operation, the sense amplifier 100 subtracts the first comparison signal Vsl and the second comparison signal Vhs from each other to output a subtracted result as an output signal. The first comparison signal Vsl, the second comparison signal Vhs and the output signal OUT are represented by mathematical formulas 4 through 6.

$$Vsl = Vsel - Vlow \quad \text{[mathematical formula 4]}$$

$$Vhs = Vhigh - Vsel \quad \text{[mathematical formula 5]}$$

$$OUT = Vhs - Vsl = Vhigh + Vlow - 2Vsel = 2(Vref - Vsel) = 2Vd \quad \text{[mathematical formula 6]}$$

Referring to the mathematical formulas 4, 5 and 6, the sense amplifier 100 may provide two times voltage margin (Vd) as an output signal through a two-stage comparison operation.

The sense amplifier 100 according to the exemplary embodiments described with reference to FIGS. 6 and 7 may perform a data sensing operation more precisely compared with simply comparing the intermediate reference signal (Iref, Vref) with the sensing target signal (Isel, Vsel), respectively.

Figure 8:
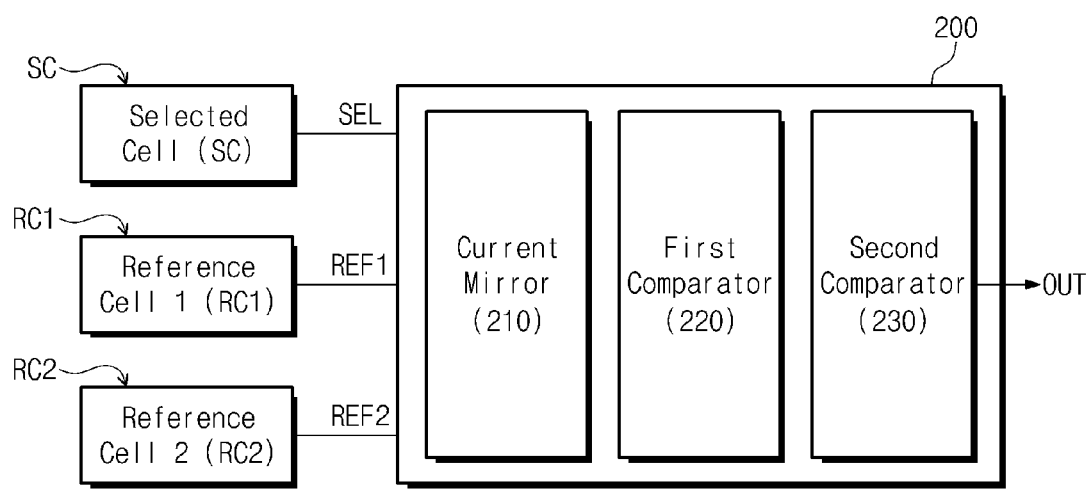
FIG. 8 is a block diagram illustrating a sense amplifier of FIG. 5, according to an exemplary embodiment.

FIG. 8 is a block diagram illustrating additional details of the sense amplifier of FIG. 5, according to an exemplary embodiment. Referring to FIG. 8, a sense amplifier 200 includes a current mirror 210, a first comparator 220 and a second comparator 230.

The sense amplifier 200 is a current mode sense amplifier. The sense amplifier 200 may sense data stored in a selected memory cell through a first comparison operation comparing a plurality of reference signals with a sensing target signal respectively, and a second comparison operation being performed based on the results of the first comparison operation.

The sense amplifier 200 is connected to a selected memory cell SC, a first reference cell RC1 and a second reference cell RC2. The sense amplifier 200 receives a sensing target signal SEL from the selected memory cell SC. The sense amplifier 200 receives a first reference signal REF1 and a second reference signal REF2 from the first reference cell RC1 and the second reference cell RC2, respectively. In this exemplary embodiment, the first and second reference signals REF1 and REF2 are provided in the form of a reference current.

The current mirror 210 copies the sensing target signal SEL, the first reference signal REF1 and the second reference signal REF2. In this exemplary embodiment, the current mirror 210 may comprise a plurality of transistors. The plurality of transistors may be MOS transistors. The current mirror 210 may stably provide the sensing target signal SEL, and the first and second reference signals REF1 and REF2 to the first comparator 220 through a mirroring operation.

The first comparator 220 compares the sensing target signal SEL with the first reference signal REF1 and the second reference signal REF2, respectively, provided from the current mirror 210 to generate a first comparison signal and a second comparison signal, respectively. The first comparator 220 provides the generated first and second comparison signals to the second comparator 230.

The second comparator 230 compares the first comparison signal and the second comparison signal provided from the first comparator 220 to generate an output signal OUT. The second comparator 230 may comprise a plurality of transistors. The plurality of transistors may be MOS transistors.

As described with reference to FIGS. 6 and 7, the sense amplifier 200 may precisely perform a data sensing operation using a two-stage comparison operation using the first and second comparators 220 and 230.

Figure 9:
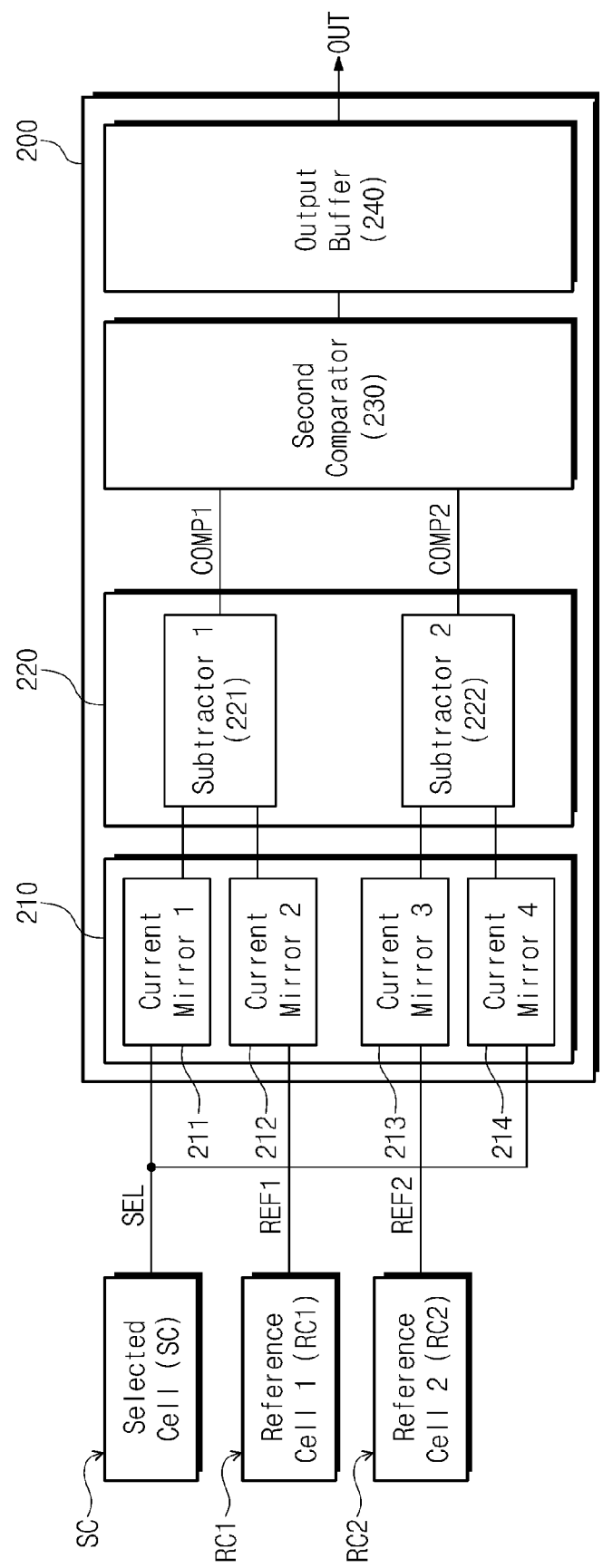
FIG. 9 is a block diagram illustrating a sense amplifier of FIG. 5, according to another exemplary embodiment.

FIG. 9 is a block diagram illustrating a sense amplifier of FIG. 5, according to another exemplary embodiment. Referring to FIG. 9, a sense amplifier 200 includes a current mirror 210, a first comparator 220, a second comparator 230 and an output buffer 240.

The sense amplifier 200 is a current mode sense amplifier. The sense amplifier 200 may sense data stored in a selected memory cell through a first comparison operation comparing a plurality of reference signals with a sensing target signal respectively, and a second comparison operation being performed based on the results of the first comparison operation. The sense amplifier 200 may output a sensing result in low output impedance using the output buffer 240.

The sense amplifier 200 is connected to a selected memory cell SC, a first reference cell RC1 and a second reference cell RC2. The sense amplifier 200 receives a sensing target signal SEL from the selected memory cell SC. The sense amplifier 200 receives a first reference signal REF1 and a second reference signal REF2 from the first reference cell RC1 and the second reference cell RC2, respectively. In this exemplary embodiment, the first and second reference signals REF1 and REF2 are provided in the form of a reference current.

The current mirror 210 includes a plurality of current mirrors. The current mirror 210 includes a first current mirror 211, a second current mirror 212, a third current mirror 213, and a fourth current mirror 214. However, this is only an example, and the number of current mirrors included in the current mirror 210 may be changed depending on the number of reference cells connected to the sense amplifier 200.

The first and fourth current mirrors 211 and 214 receive the sensing target signal SEL from the selected memory cell SC. The first and fourth current mirrors 211 and 214 copy the received sensing target signal SEL to provide the received sensing target signal SEL to the first comparator 220.

The second and third current mirrors 212 and 213 receive the first and second reference signals REF1 and REF2, respectively, from the first and second reference cells RC1 and RC2 respectively. The second and third current mirrors 212 and 213 copy the received first and second reference signals REF1 and REF2, respectively, to provide the received first and second reference signals REF1 and REF2 to the first comparator 220.

The first comparator 220 includes a plurality of subtractors. In this exemplary embodiment, the first comparator 220 includes a first subtractor 221 and a second subtractor 222. However, this is only an example, and the number of subtractors included in the first comparator 220 may be changed depending on the number of reference cells connected to the sense amplifier 200.

The first subtractor 221 subtracts the sensing target signal SEL copied by the first current mirror 211 and the first reference signal REF1 copied by the second current mirror 212 from each other to generate a first comparison signal COMP1. The second subtractor 222 subtracts the sensing target signal SEL copied by the fourth current mirror 214 and the second reference signal REF2 copied by the third current mirror 213 from each other to generate a second comparison signal COMP2.

The second comparator 230 compares the first and second comparison signals COMP1 and COMP2 to output a comparison result. The second v 230 can amplify a difference between the first and second comparison signals COMP1 and COMP2 to output the amplified difference. In this exemplary embodiment, the second comparator 230 may include a single-ended differential amplifier.

The output buffer buffers a signal provided from the second comparator 230 to output an output signal OUT. The output buffer 240 may comprise a plurality of transistors. The plurality of transistors may be MOS transistors. The output buffer 240 may comprise a pair of transistors, e.g., a PMOS pull-up transistor and a NMOS pull-down transistor.

The sense amplifier 200 may sense data stored in a selected memory cell through a first comparison operation comparing a plurality of reference signals with a sensing target signal respectively, and a second comparison operation being performed based on a result of the first comparison operation. The sense amplifier 200 may output a sensing result in low output impedance using the output buffer 240.

Figure 10:
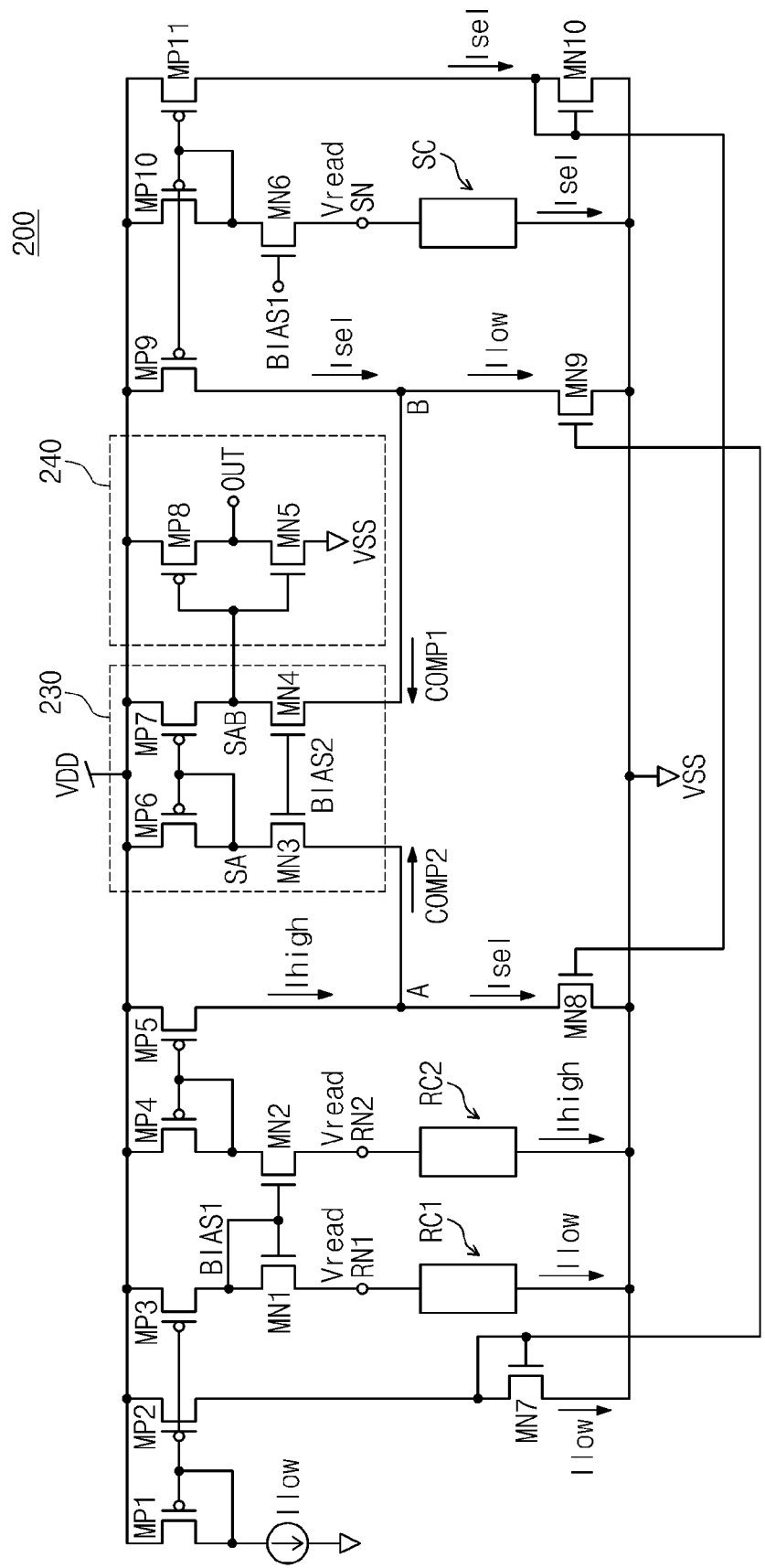
FIG. 10 is a circuit diagram illustrating a sense amplifier of FIG. 5, according to yet another exemplary embodiment.

FIG. 10 is a circuit diagram illustrating a sense amplifier of FIG. 5, according to another exemplary embodiment. Referring to FIG. 10, the sense amplifier 200 may comprise a plurality of MOS transistors.

The source and drain terminals of a first PMOS transistor MP1 are connected to a power supply voltage VDD and a current source Ilow, respectively. The first PMOS transistor MP1 and the current source Ilow perform a function of a current source supplying a constant current Ilow to a first reference cell RC1.

A second PMOS transistors MP2 and a third PMOS transistor MP3 share a gate terminal with the first PMOS transistor MP1. The first through third PMOS transistors MP1, MP2, and MP3 together constitute a current mirror. The drain terminals of the second and third PMOS transistors MP2 and MP3 are provided with the same current as the current Ilow being provided to the drain terminal of the first PMOS transistor MP1.

A seventh NMOS transistor MN7 and a ninth NMOS transistor MN9 constitute a current mirror. A gate of the seventh NMOS transistor MN7 and a gate of the ninth NMOS transistor MN9 are connected together. The current Ilow flowing through a drain terminal of the seventh NMOS transistor MN7 and through the second PMOS transistor MP2 is copied at a drain terminal of the ninth NMOS transistor MN9.

The current Ilow being provided by the third PMOS transistor MP3 is provided to a first reference cell RC1 through a first NMOS transistor MN1. A voltage Vread of a first reference node RN1 is determined by a level of the current Ilow and a resistance value of the first reference cell RC1.

The first NMOS transistor MN1 and a second NMOS transistor MN2 constitute a source follower. A voltage of a second reference node RN2 can be controlled to be the same as the voltage Vread of the first reference node RN1 by the first and second NMOS transistors MN1 and MN2.

A current Ihigh flowing through a second reference cell RC2 is determined by the voltage Vread of the second reference node RN2 and a resistance value of the second reference cell RC2. Since the voltage Vread of the first reference node RN1 is the same as the voltage of the second reference node RN2, a ratio of the current Ilow flowing through the first reference cell RC1 to the current Thigh flowing through the second reference cell RC2 is determined by a resistance ratio of the first and second reference cells RC1 and RC2.

Fourth and fifth PMOS transistors MP4 and MP5 constitute a current mirror. The current flowing through the second reference cell RC2 is copied at a drain terminal of the fifth PMOS transistor MP5 through the fourth and fifth PMOS transistors MP4 and MP5.

A sixth NMOS transistor MN6 constitutes a source follower having the same input bias BIAS1 as the first and second NMOS transistor MN1 and MN2. A voltage Vread of a select node SN can be controlled to be the same as the voltage Vread of the first and second reference nodes RN1 and RN2 by the sixth NMOS transistor MN6.

A current Isel flowing through a selected memory cell SC is determined by the voltage Vread of the select node SN and a resistance value of the selected memory cell SC. Since ninth, tenth and eleventh PMOS transistors MP9, MP10 and MP11 constitute a current mirror, a current which is the same as the current Isel flowing through the tenth PMOS transistor MP10 is copied at drain terminals of the ninth and eleventh PMOS transistors MP9 and MP11.

Eighth and tenth NMOS transistors MN8 and MN10 constitute a current mirror, and gate terminals of the eighth and tenth NMOS transistors MN8 and MN10 are connected together. The current Isel being provided to the tenth NMOS transistor MN10 through the eleventh PMOS transistor MP11 is copied at a drain terminal of the eighth NMOS transistor NMB.

At a node A, the current Thigh flowing through the second reference cell RC2 and the current Isel flowing through the selected memory cell SC in response to the same voltage Vread are subtracted from each other. At a node B, the current Bow flowing through the first reference cell RC1 and the current Isel flowing through the selected memory cell SC in response to the same voltage Vread are subtracted from each other.

Third and fourth NMOS transistors MN3 and MN4 and sixth and seventh PMOS transistors MP6 and MP7 constitute a second comparator 230. The third and fourth NMOS transistors MN3 and MN4 constitute a differential input part. The sixth and seventh PMOS transistors MP6 and MP7 constitute a current mirror. The second comparator 230 is connected to the node A and the node B to amplify a difference between currents being provided from the node A and the node B.

An eighth PMOS transistor MP8 and a fifth NMOS transistor MN5 constitute an output buffer 240. The eighth PMOS transistor MP8 and the fifth NMOS transistor MN5 may be a pair of a pull-up transistor and a pull-down transistor. The output buffer 240 buffers a voltage being provided from an output node SAB of the second comparator 230 to provide an output signal OUT.

The sense amplifier 200 may provide the same voltage Vread to the first and second reference cells RC1 and RC2, and the selected memory cell SC. The sense amplifier 200 may subtract the current Ilow flowing through the first reference cell RC1 from the current Isel flowing through the selected memory cell SC to generate the first comparison signal COMP1, and may subtract the current Thigh flowing through the second reference cell RC2 from the current Isel flowing through the selected memory cell SC to generate the second comparison signal COMP2. The sense amplifier 200 amplifies a difference between the first and second comparison signals COMP1 and COMP2 to output the output signal OUT. Accordingly, the data stored in the selected memory cell SC can be distinguished based on a level of the output signal OUT.

Since the sense amplifier 200 provides the same voltage Vread to the first and second reference cells RC1 and RC2 and the selected memory cell SC and may control a level of the voltage Vread, the sense amplifier 200 may sense the selected memory cell SC by a nondestructive voltage which does not change a state of the selected memory cell SC.

The sense amplifier 200 illustrated in FIG. 10 is only an exemplary embodiment. A technical spirit of the inventive concept is not limited to the sense amplifier 200 described above.

Figure 11:
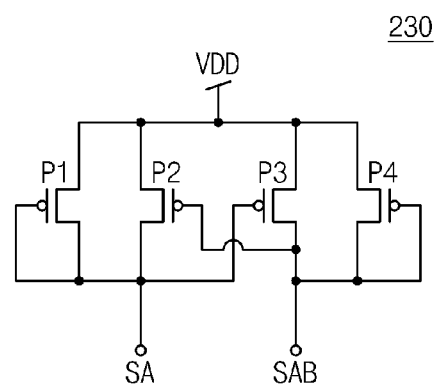
FIG. 11 is a circuit diagram illustrating a second comparator of the sense amplifier of FIG. 10, according to a modified exemplary embodiment.

FIG. 11 is a circuit diagram illustrating a second comparator of FIG. 10, according to a modified exemplary embodiment. Referring to FIG. 11, the second comparator 230 may include first, second, third and fourth transistors P1, P2, P3 and P4. Although not illustrated in FIG. 11, a differential input part may be connected to differential input terminals SA and SAB of the second comparator 230. The differential input part can be constituted by the third and fourth NMOS transistors MN3 and MN4 of FIG. 10.

The first and third transistors P1 and P3 may constitute a current mirror sharing a gate terminal. The second and fourth transistors P2 and P4 may constitute a current mirror sharing a gate terminal. Through a mirroring operation of the first, second, third and fourth transistors P1, P2, P3 and P4, the second comparator 230 amplifies a difference of currents being provided from the node SA and the node SAB to output the difference of currents to the node SAB.

As described above, it will be appreciated that constituent elements of the second comparator 230 may be provided in many different forms.

Figure 12:
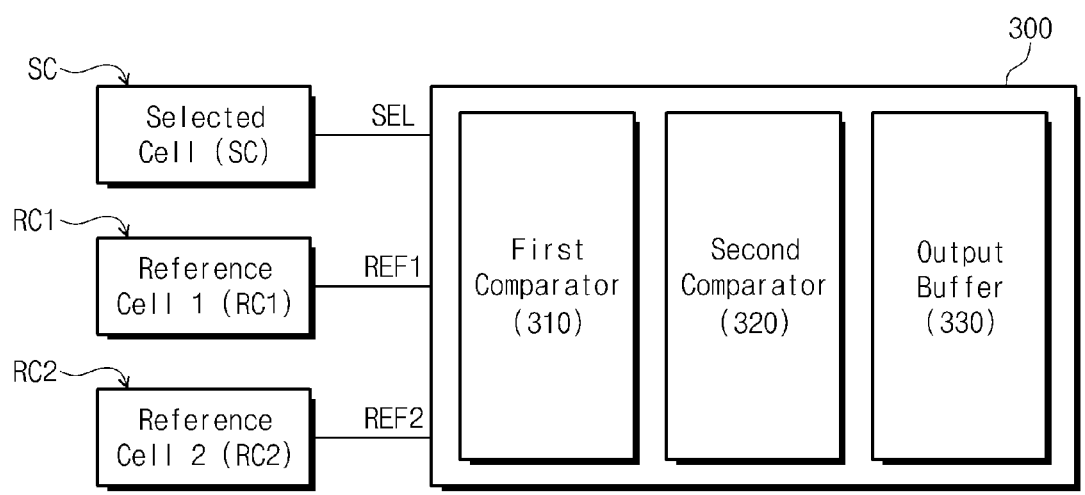
FIG. 12 is a block diagram illustrating a sense amplifier of FIG. 5, according to yet another exemplary embodiment.

FIG. 12 is a block diagram illustrating a sense amplifier of FIG. 5, according to yet another exemplary embodiment. Referring to FIG. 12, a sense amplifier 300 includes a first comparator 310, a second comparator 310 and an output buffer 330.

The sense amplifier 300 is a voltage mode sense amplifier. The sense amplifier 300 can sense data stored in a selected memory cell through a first comparison operation comparing a plurality of reference signals with a sensing target signal respectively, and a second comparison operation being performed based on a result of the first comparison operation.

The sense amplifier 300 is connected to a selected memory cell SC, a first reference cell RC1 and a second reference cell RC2. The sense amplifier 300 receives a sensing target signal SEL from the selected memory cell SC. The sense amplifier 300 receives a first reference signal REF1 and a second reference signal REF2 from the first reference cell RC1 and the second reference cell RC2 respectively. In this exemplary embodiment, the first and second reference signals REF1 and REF2 are provided in the form of a reference voltage.

The first comparator 310 compares the sensing target signal SEL with the first and second reference signals REF1 and REF2 to generate a first comparison signal and a second comparison signal, respectively. The first comparator 310 provides the generated first and second comparison signals to the second comparator 320.

The second comparator 320 compares the first and second comparison signals provided from the first comparator 310. The output buffer 330 buffers a comparison result of the second comparator 320 to generate an output signal OUT. In this exemplary embodiment, the second comparator 320 and the output buffer 330 may comprise a plurality of transistors. The plurality of transistors may be MOS transistors.

As described with reference to FIGS. 6 and 7, the sense amplifier 300 may precisely perform a data sensing operation through a two-stage comparison operation using the first and second comparators 310 and 320.

Figure 13:
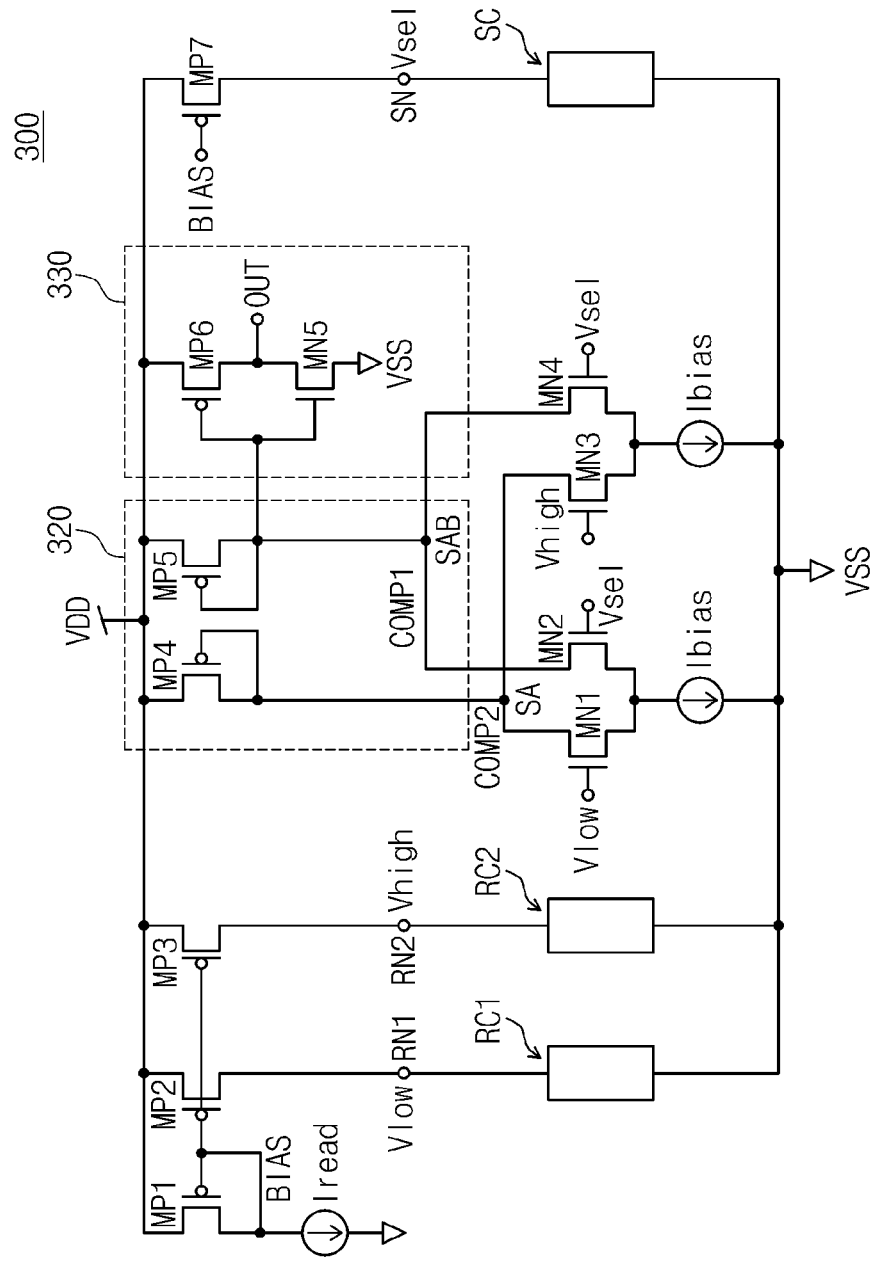
FIG. 13 is a circuit diagram illustrating a sense amplifier of FIG. 12, according to another exemplary embodiment.

FIG. 13 is a circuit diagram illustrating a sense amplifier of FIG. 12, according to an exemplary embodiment. Referring to FIG. 13, the sense amplifier 300 may comprise a plurality of MOS transistors.

Source and drain terminals of a first PMOS transistor MP1 are connected to a power supply voltage VDD and a current source Tread respectively. The first PMOS transistor MP1 and the current source Tread perform a function of a current source supplying a constant current Tread to a first reference cell RC1 and a second reference cell RC2.

The first PMOS transistor MP1, the second PMOS transistor MP2 and the third PMOS transistor MP3 constitute a current mirror. Gates of the first, second, and third PMOS transistors MP1, MP2, and MP3 are connected together. Drain terminals of the second and third PMOS transistors MP2 and MP3 are provided with the same current as the current Tread being provided to a drain terminal of the first PMOS transistor MP1. Voltages Vlow and Vhigh of first and second reference nodes RN1 and RN2 are determined by a current being provided from the second and third PMOS transistors MP2 and MP3 and resistance values of the first and second reference cells RC1 and RC2, respectively.

The selected memory cell SC is provided with the same current as the current Tread being provided to the first and second reference cells RC1 and RC2 by a seventh PMOS transistor MP7 having the same drain and gate voltages as the first PMOS transistor MP1.

A voltage Vsel of a select node SN is determined by a current being provided from the seventh PMOS transistor MP7 and a resistance value of the selected memory cell SC. Since a level of a current being provided from the second, third and seventh PMOS transistors MP2, MP3 and MP7 is equally controlled by a mirroring operation, a voltage difference between the first and second reference nodes RN1 and RN2 and the select node SN is determined based on a resistance difference between the first and second reference nodes RN1 and RN2 and the select node SN.

First, second, third and fourth NMOS transistors MN1, MN2, MN3 and MN4 constitute a first comparator. The first comparator subtracts a voltage Vlow of the first reference node RN1 and a voltage Vsel of the select node SN from each other, and subtracts a voltage Vhigh of the second reference node RN2 and a voltage Vsel of the select node SN from each other to generate a first comparison signal COMP1 and a second comparison signal COMP2, respectively, on the basis of a subtraction result.

The first and second NMOS transistors MN1 and MN2 constitute a differential pair of which source terminals are connected to each other. Source terminals of the first and second NMOS transistors MN1 and MN2 are connected to a tail current Ibias. The voltage Vlow of the first reference node RN1 and the voltage Vsel of the select node SN are provided to gate terminals of the first and second NMOS transistors MN1 and MN2 respectively. The first and second NMOS transistors MN1 and MN2 convert a difference between the voltage Vlow of the first reference node RN1 and the voltage Vsel of the select node SN into a current difference flowing through drain terminals of the first and second NMOS transistors MN1 and MN2.

The third and fourth NMOS transistors MN3 and MN4 constitute a differential pair of which source terminals are connected to each other. Source terminals of the third and fourth NMOS transistors MN3 and MN4 are connected to a tail current Ibias. The voltage Vhigh of the second reference node RN2 and the voltage Vsel of the select node SN are provided to gate terminals of the third and fourth NMOS transistors MN3 and MN4 respectively. The third and fourth NMOS transistors MN3 and MN4 convert a difference between the voltage Vhigh of the second reference node RN2 and the voltage Vsel of the select node SN into a current difference flowing through drain terminals of the third and fourth NMOS transistors MN3 and MN4.

Drain terminals of the first and third NMOS transistors MN1 and MN3 are connected to a node SA to provide the second comparison signal COMP2 to a second comparator 320. Drain terminals of the second and fourth NMOS transistors MN2 and MN4 are connected to a node SAB to provide the first comparison signal COMP1 to the second comparator 320.

Fourth and fifth PMOS transistors MP4 and MP5 constitute the second comparator 320. The fourth and fifth PMOS transistors MP4 and MP5 may be biased in a diode form. Drain terminals of the fourth and fifth PMOS transistors MP4 and MP5 are connected to the node SA and the node SAB respectively. The second comparator 320 amplifies a difference between the comparison signals COMP1 and COMP2 being provided from the first comparator to output the amplified difference.

A sixth PMOS transistor MP6 and a fifth NMOS transistor MN5 constitute an output buffer 330. The sixth PMOS transistor MP6 and the fifth NMOS transistor MN5 may be a pair of a pull-up transistor and a pull-down transistor. The output buffer 330 buffers a voltage being provided from the output node SAB of the second comparator 320 to provide an output signal OUT.

The sense amplifier 300 may provide the same current to the first and second reference cells RC1 and RC2 and the selected memory cell SC. The sense amplifier 300 may compare the voltages Vlow and Vhigh generated from the first and second reference cells RC1 and RC2 with the voltage Vsel generated from the selected memory cell SC respectively in response to the current Tread to generate the first and second comparison signals COMP1 and COMP2. The sense amplifier 300 amplifies a difference between first and second comparison signals COMP1 and COMP2 to output an output signal OUT. Accordingly, the data stored in the selected memory cell SC may be distinguished based on a level of the output signal OUT.

Since the sense amplifier 300 provides the same current Tread to the first and second reference cells RC1 and RC2 and the selected memory cell SC, and may control a level of the current Tread, the sense amplifier 300 can sense the selected memory cell SC by a nondestructive current which does not change a state of the selected memory cell SC.

The sense amplifier 300 illustrated in FIG. 13 is only an exemplary embodiment. A technical spirit of the inventive concept is not limited to the circuit described above.

Figure 14:
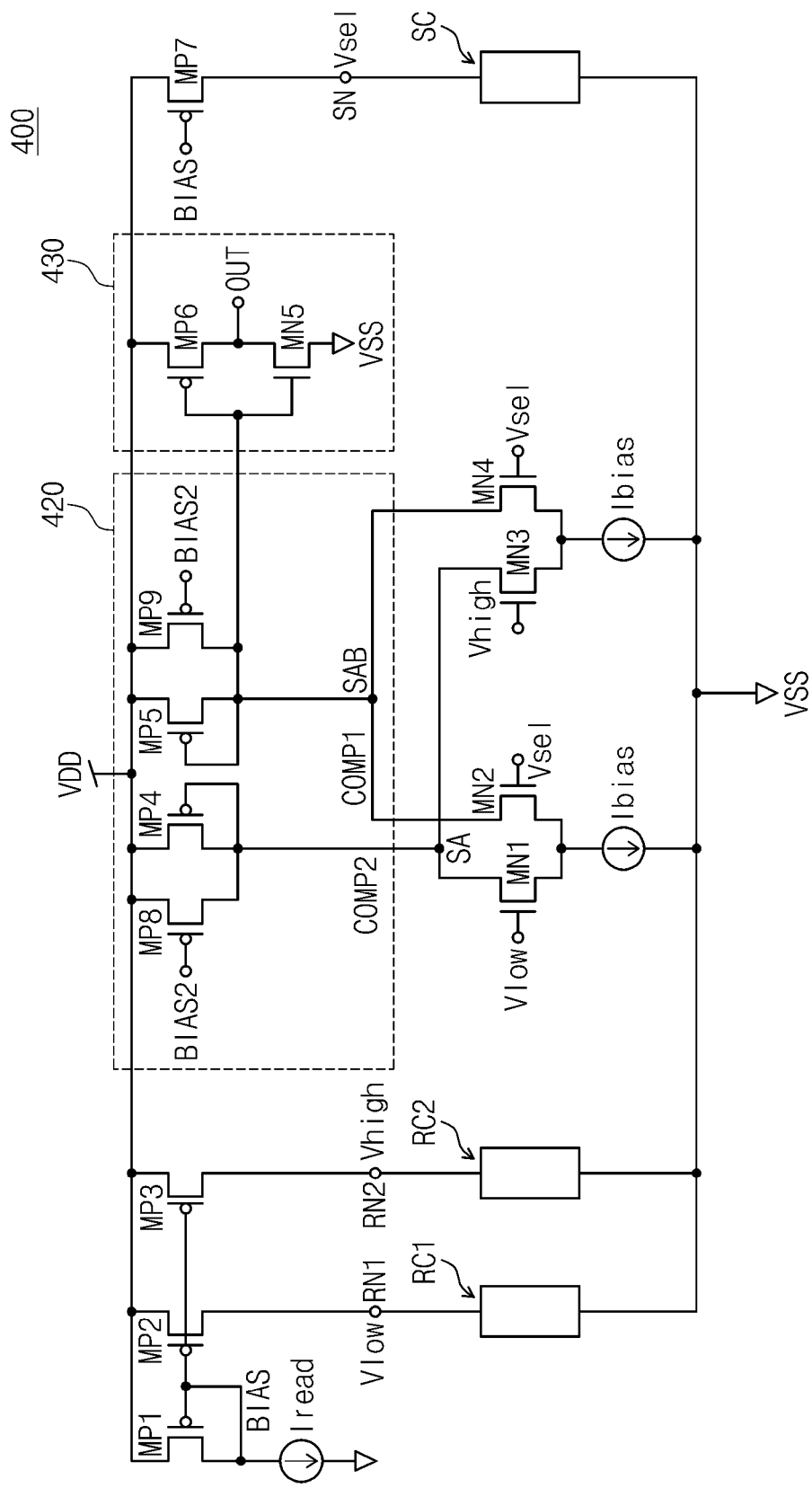
FIG. 14 is a circuit diagram illustrating a sense amplifier of FIG. 12, according to another exemplary embodiment.

FIG. 14 is a circuit diagram illustrating a sense amplifier of FIG. 12, according to another exemplary embodiment. A sense amplifier 400 further includes eighth and ninth PMOS transistors MP8 and MP9 as compared with the sense amplifier 300 of FIG. 13.

The same bias voltage BIAS 2 is provided to gate terminals of the eighth and ninth PMOS transistors MP8 and MP9. Source terminals of the eighth and ninth PMOS transistors MP8 and MP9 are connected to a power supply voltage VDD. Drain terminals of the eighth and ninth PMOS transistors MP8 and MP9 are connected to a node SA and a node SAB respectively.

The eighth and ninth PMOS transistors MP8 and MP9 and the fourth and fifth PMOS transistors MP4 and MP5 may constitute a second comparator 420. The eighth and ninth PMOS transistors MP8 and MP9 stabilize an operation of the second comparator 420.

As described above, constituent elements including the second comparator 320 may be provided in many different forms.

Figure 15:
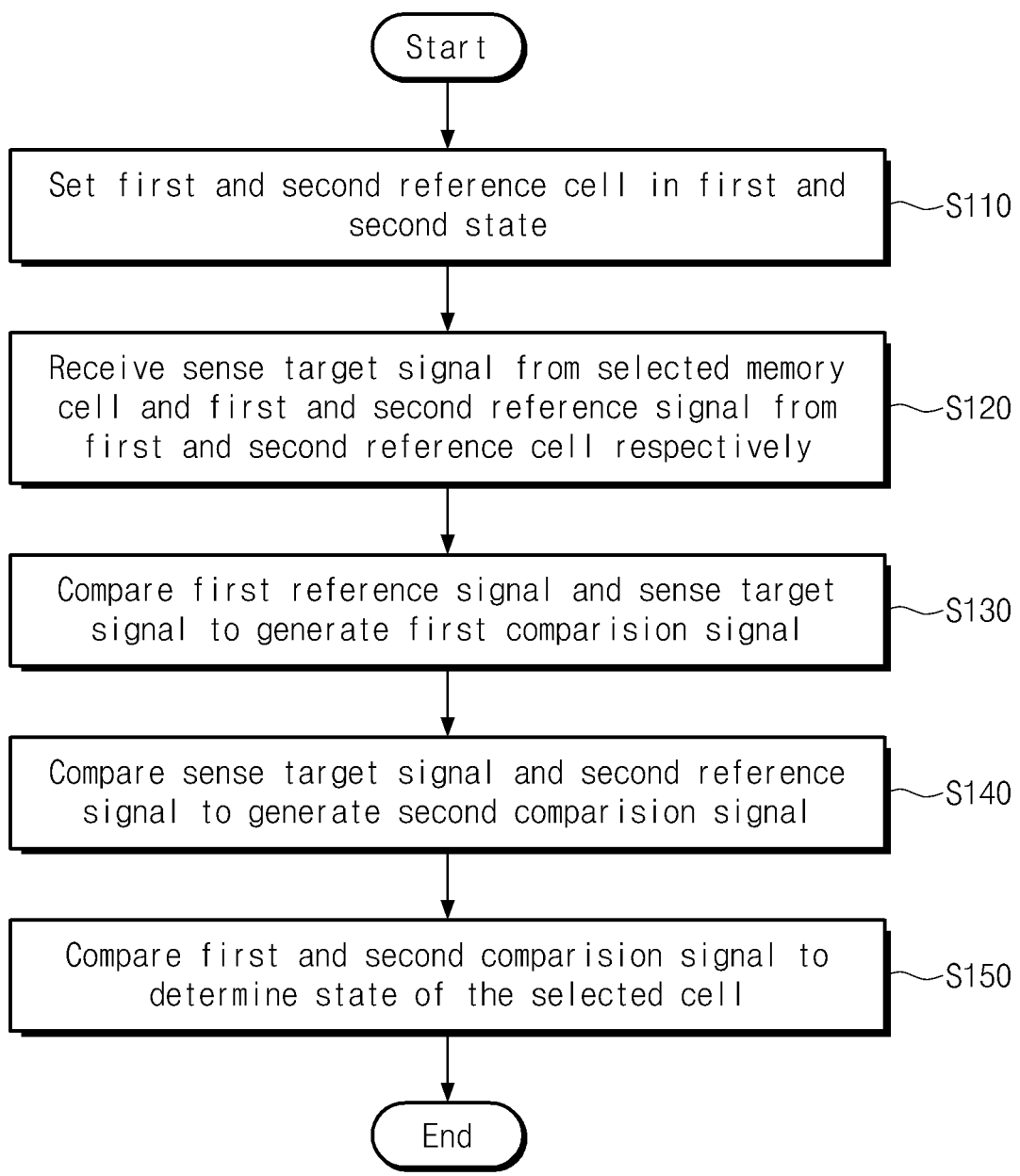
FIG. 15 is a flow chart illustrating a sensing method of a nonvolatile memory device according to an exemplary embodiment.

FIG. 15 is a flow chart illustrating a sensing method of a nonvolatile memory device, according to an exemplary embodiment.

In operation S110, first and second reference cells are set to a first state and a second state, respectively, in which the second state is different from the first state. The first state reference cell stores a 1 bit value. The second state reference cell stores a 2 bit value. The 1 bit value may be data "0". The 2 bit value may be data "1".

In operation S120, a sensing target signal is received from a selected memory cell, and first and second reference signals are received from first and second reference cells respectively. In an exemplary embodiment, the sensing target signal and the first and second reference signals may be provided in the form of a current. In this case, the sensing target signal and the first and second reference signals may be currents which the selected memory cell and the first and second reference cells provide in response to a reference voltage of the same level. In another exemplary embodiment, the sensing target signal and the first and second reference signals may be provided in the form of a voltage. In this case, the sensing target signal and the first and second reference signals may be voltages which the selected memory cell and the first and second reference cells generate in response to a reference current of the same level.

In operation S130, a first comparison signal is generated by comparing the first reference signal with the sensing target signal. In an exemplary embodiment, the first comparison signal may be generated by subtracting the first reference signal and the sensing target signal from each other.

In operation S140, a second comparison signal is generated by comparing the second reference signal with the sensing target signal. In an exemplary embodiment, the second comparison signal can be generated by subtracting the second reference signal and the sensing target signal from each other.

In operation S150, the first and second comparison signal are compared to determine a state of the selected cell. For example, data stored in the selected memory cell is distinguished by comparing the first and second comparison signals generated in the operation S140. The data stored in the selected memory cell may be distinguished based on a state of the selected memory cell. A nonvolatile memory device amplifies a difference between the first and second comparison signals and may distinguish a state of the selected memory cell on the basis of the amplified difference value.

According to the sensing method of the nonvolatile memory device described above, the nonvolatile memory device may generate a plurality of reference signals using a plurality of reference cells written in a different state. The nonvolatile memory device may perform a first comparison operation that compares the reference signals with the sensing target signal provided from the selected memory cell respectively. The nonvolatile memory device may then perform a second comparison operation on the basis of a result of the first comparison operation to sense data stored in the selected memory cell. The nonvolatile memory device may thus precisely sense data using the reference signals being generated from the reference cells through at least two comparison operations.

Figure 16:
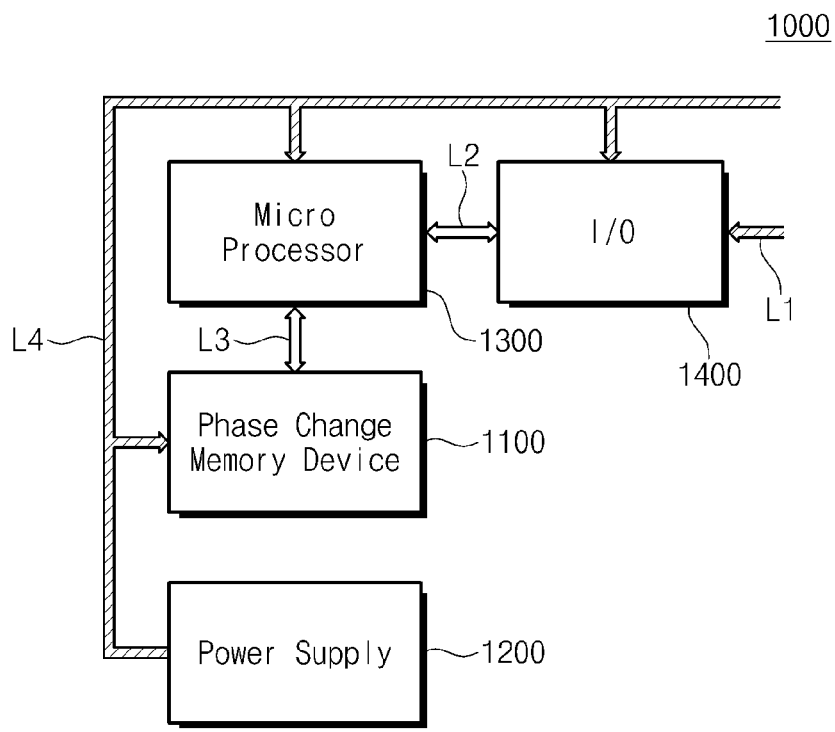
FIG. 16 is a block diagram illustrating a mobile electronic system including a nonvolatile memory device, according to exemplary embodiments.

FIG. 16 is a block diagram of a mobile electronic system including a phase change memory device which is a nonvolatile memory device in accordance with some exemplary embodiments. The mobile electronic system 1000 includes a phrase change memory device 1100, a microprocessor 1300, an input/output (I/O) 1400, and a power supply 1200. The phase change memory device 1100 may generate a plurality of reference signals using a plurality of reference cells written in a different state. The phase change memory device 1100 may perform a first comparison operation that compares the reference signals with the sensing target signal provided from the selected memory cell respectively. The phase change memory device 1100 may perform a second comparison operation on the basis of a result of the first comparison operation to sense data stored in the selected memory cell. The phase change memory device 1100 may precisely sense data using the reference signals being generated from the reference cells through at least two comparison operations.

The phase change memory device 1100 is connected to the microprocessor 1300 through a bus line L3 and is provided as a main memory of the mobile electronic system 1000. The power supply unit 1200 supplies power to the microprocessor 1300, the input/output device 1400 and the phase change memory device 1100 through a power line L4. The microprocessor 1300 and the input/output device 1400 may be provided as a memory controller for controlling the phase change memory device 1100.

If the input/output device 1400 receives data through a line L1, the microprocessor 1300 is provided with the received data through a line L2 to process the provided data, and then the received or processed data is applied to the phase change memory device 1100 through the bus line L3. The phase change memory device 1100 stores data being applied through the bus line L3 in a memory cell. Data stored in the memory cell is read by the microprocessor 1300 and is output to the outside through the input/output device 1400.

Even when power of the power supply unit 1200 is not supplied to the power line L4, data stored in a memory cell of the phase change memory device 1100 is not lost due to the nature of a phase change material. This is because the phase change memory device 1100 is a nonvolatile memory. The phase change memory device 1100 has also advantages of a high operation speed and low power consumption as compared with other memory devices.

Figure 17:
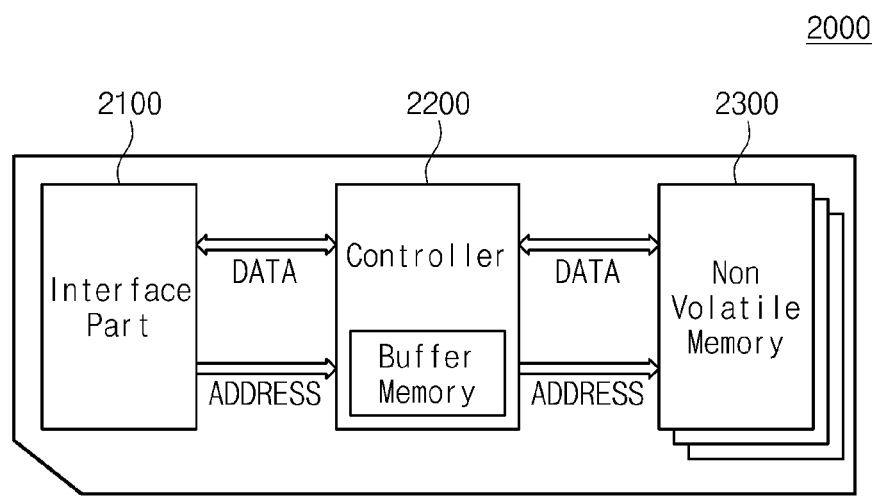
FIG. 17 is a block diagram illustrating a memory card including a nonvolatile memory device, according to exemplary embodiments.

FIG. 17 is a block diagram of a memory card including a nonvolatile memory device in accordance with some exemplary embodiments. A memory card 2000 may be, for example, a MMC card, a SD card, a multiuse card, a micro SD card, a memory stick, a compact SD card, an ID card, a PCMCIA card, a chip card, a smart card, a USB card, etc.

Referring to FIG. 17, the memory card 2000 may include an interface part performing an interface with the outside, a controller 2200 that has a buffer memory and controls an operation of the memory card 2000, and at least one nonvolatile memory device 2300 according to exemplary embodiments. For example, the at least one nonvolatile memory device 2300 may include a plurality of nonvolatile memory devices, each according to exemplary embodiments described above. The controller 2200 is a processor and can control write and read operations of the nonvolatile memory device 2300. The controller 2200 is coupled to the interface part 2100 and the at least one nonvolatile memory device 2300 through a data bus DATA and an address bus ADDRESS.

The at least one nonvolatile memory device 2300 may include a plurality of reference cells written under the same condition as memory cells of a cell array. The at least one nonvolatile memory device 2300 generates a plurality of reference signals using a plurality of reference cells written in a different state. The at least one nonvolatile memory device 2300 may perform a first comparison operation that compares the reference signals with the sensing target signal provided from the selected memory cell respectively. The at least one nonvolatile memory device 2300 may then perform a second comparison operation on the basis of a result of the first comparison operation to sense data stored in the selected memory cell. The at least one nonvolatile memory device 2300 may precisely sense data using the reference signals being generated from the reference cells through at least two comparison operations.

Figure 18:
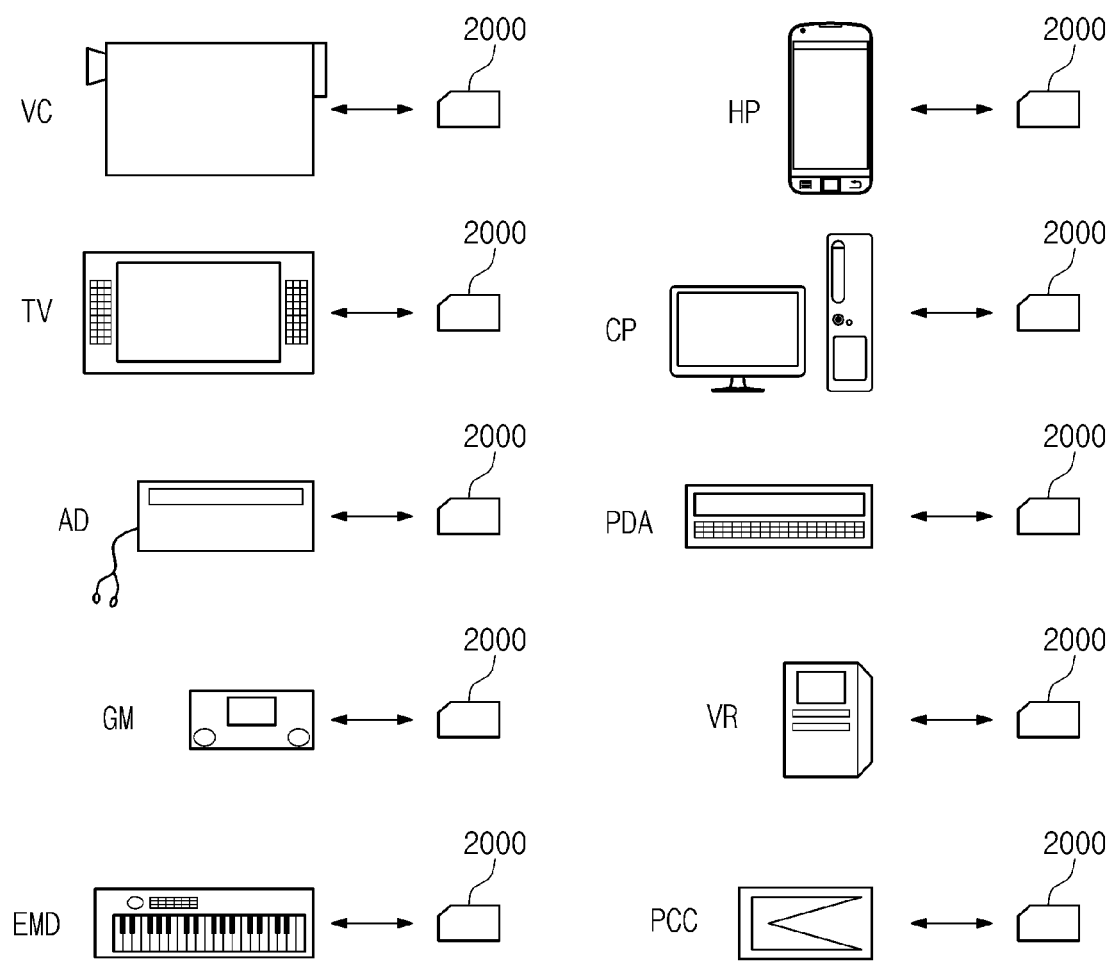
FIG. 18 is an illustrative drawing for explaining various systems in which a memory card of FIG. 17 is used.

FIG. 18 is an illustrative drawing for explaining various systems in which a memory card of FIG. 17 may be used. Referring to FIG. 18, the memory card 2000 may be used in a video camera VC, a television TV, an audio device AD, a game machine GM, an electronic music device EMD, a cell phone HP, a computer CP, a personal digital assistant (PDA), a VR, and a PC card PCC, etc.

The nonvolatile memory device may be mounted using various types of packages such as package on package (PoP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), small outline (SOIC), a shrink small outline package (SSOP), a thin small outline (TSOP), thin quad flatpack (TQFP), a system in package (SIP), a multi chip package (MCP), a wafer-level fabricated package (WFP) and a wafer-level processed stack package (WSP).

According to the exemplary embodiments, data stored in a selected memory cell may be precisely sensed by a nondestructive reference signal generated using a plurality of reference cells.

The above-disclosed subject matter is to be considered illustrative, and not restrictive, and the appended claims are intended to cover all modifications, enhancements, and other exemplary embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A sense amplifier configured to sense data stored in a selected memory cell, the sense amplifier comprising:
    a first comparator configured to generate a first comparison signal by comparing a first reference signal received from a first reference cell with a sensing target signal received from the selected memory cell, and to generate a second comparison signal by comparing the sensing target signal with a second reference signal received from a second reference cell written in a different state from the first reference cell; and
    a second comparator configured to sense the data stored in the selected memory cell by comparing the first comparison signal and the second comparison signal,
    wherein the second comparator comprises a first transistor and a second transistor, gate terminals of which are connected together and source terminals of which receive the second comparison signal and the first comparison signal respectively, and a third transistor and a fourth transistor, gate terminals of which are connected together, source terminals of which are connected to a power supply voltage, and drain terminals of which are connected to drain terminals of the first and second transistors respectively.

2. The sense amplifier of claim 1, wherein the first reference cell is written in a first state for storing data "0" and the second reference cell is written in a second state for storing data "1".

3. The sense amplifier of claim 2, wherein the selected memory cell, the first reference cell, and the second reference cell are STT-MRAM cells, and the first state is a low resistance state and the second state is a high resistance state.

4. The sense amplifier of claim 1, wherein the sensing target signal, the first reference signal, and the second reference signal are received as currents.

5. The sense amplifier of claim 4, wherein the sensing target signal, the first reference signal, and the second reference signal are currents output from the selected memory cell, the first reference cell, and the second reference cell, respectively, in response to a reference voltage of a same level.

6. The sense amplifier of claim 4, further comprising a first current mirror configured to copy the sensing target signal, the first reference signal, and the second reference signal to provide the copied sensing target signal, the copied first reference signal and the copied second reference signal, respectively, to the first comparator.

7. The sense amplifier of claim 6, wherein the first comparator is configured to generate the first comparison signal by comparing the copied first reference signal with the copied sensing target signal, and to generate the second comparison signal by comparing the copied second reference signal with the copied sensing target signal.

8. The sense amplifier of claim 7, wherein the first comparator comprises a first subtractor configured to subtract the copied first reference signal from the copied sensing target signal to generate the first comparison signal.

9. The sense amplifier of claim 8, wherein the first comparator comprises a second subtractor configured to subtract the copied sensing target signal from the copied second reference signal to generate the second comparison signal.

10. The sense amplifier of claim 9, wherein the second comparator is further configured to amplify a difference between the first comparison signal and the second comparison signal to sense the data stored in the selected memory cell on the basis of the amplified difference.

11. The sense amplifier of claim 10, wherein the first through fourth transistors of the second comparator are semiconductor transistors configured as a single-ended differential amplifier, and wherein the single-ended differential amplifier is configured to amplify the difference between the first comparison signal and the second comparison signal received as input signals of the single-ended differential amplifier.

12. The sense amplifier of claim 10, further comprising an output buffer configured to buffer the amplified difference.

13. The sense amplifier of claim 12, wherein the output buffer comprises a pull-up transistor and a pull-down transistor connected in series between the power supply voltage and a source voltage.

14. A sense amplifier configured to sense data stored in a selected memory cell, the sense amplifier comprising:
a first comparator configured to generate a first comparison signal by comparing a first reference signal received from a first reference cell with a sensing target signal received from the selected memory cell, and to generate a second comparison signal by comparing the sensing target signal with a second reference signal received from a second reference cell written in a different state from the first reference cell; and
a second comparator configured to sense the data stored in the selected memory cell by comparing the first comparison signal and the second comparison signal,
wherein the sensing target signal, the first reference signal, and the second reference signal are received as voltages,
wherein the first comparator comprises a first differential amplifier and a second differential amplifier,
wherein the first differential amplifier comprises a first transistor and a second transistor, a gate terminal of the first transistor receiving the first reference signal, a gate terminal of the second transistor receiving the sensing target signal, and the source terminals of the first transistor and the second transistor being connected together and being connected to a tail current, and
wherein the second differential amplifier comprises a third transistor of which a gate terminal receives the second reference signal and a fourth transistor of which a gate terminal receives the sensing target signal, source terminals of the fourth transistor and the third transistor being connected together and being connected to the tail current, and drain terminals of the first transistor and the third transistor are connected to each other and drain terminals of the second transistor and the fourth transistor are connected to each other.

15. The sense amplifier of claim 14, wherein the sensing target signal, the first reference signal, and the second reference signal are voltages generated by the selected memory cell, the first reference cell, and the second reference cell, respectively, in response to a reference current of a same level.

16. The sense amplifier of claim 14, wherein
the first differential amplifier is configured to convert a difference between the first reference signal and the sensing target signal into a first current difference to provide the first current difference to the second comparator, and the second differential amplifier is configured to convert a difference between the second reference signal and the sensing target signal into a second current difference to provide the second current difference to the second comparator.

17. A nonvolatile memory device comprising:
a memory cell array comprising a memory cell configured to store data, a first reference cell that is written in a first state and a second reference cell that is written in a second state different from the first state; and
a sense amplifier configured to sense the data stored in the memory cell using the first and second reference cells,
wherein the sense amplifier comprises:
a first comparator configured to compare a first reference signal received from the first reference cell with a sensing target signal received from the memory cell to generate a first comparison signal, and to compare a second reference signal received from the second reference cell with the sensing target signal to generate a second comparison signal; and
a second comparator configured to compare the first comparison signal with the second comparison signal to sense data stored in the memory cell on the basis of a comparison result,
wherein the second comparator comprises a first transistor and a second transistor, gate terminals of which are connected together and source terminals of which receive the second comparison signal and the first comparison signal respectively, and a third transistor and a fourth transistor, gate terminals of which are connected together, source terminals of which are connected to a power supply voltage, and drain terminals of which are connected to drain terminals of the first and second transistors respectively.

* * * * *